United States Patent
Larson et al.

(10) Patent No.: US 10,103,503 B1
(45) Date of Patent: Oct. 16, 2018

(54) MOUNTING ASSEMBLY FOR AN ELECTRONIC DEVICE

(71) Applicant: Caterpillar Inc., Peoria, IL (US)

(72) Inventors: Scott Douglas Larson, Brimfield, IL (US); Cole C. Deichert, Washington, IL (US)

(73) Assignee: Caterpillar Inc., Deerfield, IL (US)

( * ) Notice: Subject to any disclaimer, the term of this patent is extended or adjusted under 35 U.S.C. 154(b) by 0 days.

(21) Appl. No.: 15/716,727

(22) Filed: Sep. 27, 2017

(51) Int. Cl.
*H01R 13/04* (2006.01)
*H01R 13/66* (2006.01)
*H01R 13/73* (2006.01)
*B60R 16/023* (2006.01)
*H01R 12/50* (2011.01)

(52) U.S. Cl.
CPC ..... *H01R 13/6658* (2013.01); *B60R 16/0238* (2013.01); *H01R 13/73* (2013.01); *H01R 23/7073* (2013.01)

(58) Field of Classification Search
CPC ... H01R 13/567; H01R 13/5841; H01R 24/28
USPC ................................. 439/469, 694
See application file for complete search history.

(56) References Cited

U.S. PATENT DOCUMENTS

| | | | |
|---|---|---|---|
| 6,866,528 B2 | 3/2005 | Bigotto | |
| 6,926,552 B2 | 8/2005 | Mueller et al. | |
| 8,057,261 B1 * | 11/2011 | Desio | H01R 13/506 439/625 |
| 8,439,712 B2 * | 5/2013 | Wiest | H01L 31/05 439/694 |
| 9,270,018 B2 | 2/2016 | Mierke et al. | |
| 2003/0232543 A1 * | 12/2003 | Takada | H01R 13/562 439/694 |
| 2009/0017678 A1 | 1/2009 | Meier et al. | |
| 2013/0164996 A1 * | 6/2013 | Miyakawa | H01R 13/111 439/694 |

FOREIGN PATENT DOCUMENTS

FR    2773913    1/2007

* cited by examiner

*Primary Examiner* — Phuong Dinh
(74) *Attorney, Agent, or Firm* — James S. Bennin (57) ABSTRACT

A mounting assembly for an electronic device associated with a machine includes a housing including an interior space adapted to receive the one or more components of the electronic device. The mounting assembly also includes a housing printed circuit board having a first row of pins and a second row of pins. The mounting assembly further includes a harness for allowing interface between the electronic device and the machine. The harness is configured to be connected to the housing in a first orientation or a second orientation. The harness includes a cable and a connecting member provided at one end of the cable. The harness also includes a harness printed circuit board having a first row of pins and a second row of pins. The harness printed circuit board is configured to connect with the housing printed circuit board in any one of the first orientation or the second orientation.

20 Claims, 8 Drawing Sheets

MOUNTING ASSEMBLY FOR AN ELECTRONIC DEVICE

TECHNICAL FIELD

The present disclosure relates to a mounting assembly for an electronic device associated with a machine.

BACKGROUND

Machines, such as those used in construction environments, generally include one or more electronic devices associated therewith. Such electronic devices interface with the machines to transmit and receive machine location and other machine related information. One such electronic device is a telematics device. The telematics device transmits machine information to a base station, via a communication network of the machine. The telematics device may also receive information from the base station for controlling one or more operations of the machine.

In some cases, the electronic devices are mounted on a roof of an operator cab of the machine. A mounting assembly is used to mount the electronic device on the operator cab. For example, the mounting assembly can be used to mount a telematics device on a machine. Based on a type of the machine, a harness of the telematics device may be coupled with a housing of the mounting assembly in multiple configurations (e.g., such that the harness exits from a side of the housing or from a bottom of the housing). The multiple configurations increase the level of complexity associated with the mounting assembly and increase the time associated with mounting the electronic devices on a machine.

U.S. Pat. No. 9,270,018 describes a rooftop antenna. The rooftop antenna includes a base that has a protruding base foot part on the base lower side. The base foot part is formed integrally with the remaining part of the base and is electrically conductive or coated, together with the base, with an electrically conductive layer. The base foot part also has a channel for accommodating the coaxial line. Further, the coaxial line is inserted into the channel of the base foot part in such a way that at least one section of the outer circumference of the outer conductor of the coaxial line is pressed mechanically to make direct current (DC) contact with the electrically conductive inner wall of the channel.

SUMMARY OF THE DISCLOSURE

In one aspect of the present disclosure, a mounting assembly for an electronic device associated with a machine is provided. The mounting assembly includes a housing, of the electronic device, including an interior space adapted to receive one or more components of the electronic device. The housing further includes an external enclosure defined by walls of the housing. The mounting assembly also includes a housing printed circuit board coupled to the housing. The housing printed circuit board includes a first row of pins and a second row of pins. The mounting assembly further includes a harness for allowing interface between the electronic device and the machine. The harness is configured to be connected to the housing in a first orientation or a second orientation. The first orientation is substantially in perpendicular to the second orientation. Further, the harness includes a cable and a connecting member provided at one end of the cable. The connecting member is adapted to be received within the external enclosure of the housing. The harness also includes a harness printed circuit board having a first row of pins and a second row of pins. A plurality of pins, of the first row of pins, of the harness printed circuit board are inactive in each of the first orientation and the second orientation. Further, the harness printed circuit board is configured to connect with the housing printed circuit board. In the first orientation, the first row of pins of the housing printed circuit board is connected to the first row of pins of the harness printed circuit board and the second row of pins of the housing printed circuit board is connected to the second row of pins of the harness printed circuit board. Additionally, in the first orientation, two pins of a plurality of pins, of the first row of pins, of the housing printed circuit board establish a connection with corresponding two pins of the first row of pins, of the harness printed circuit board. Further, in the second orientation, the first row of pins of the housing printed circuit board is connected to the second row of pins of the harness printed circuit board and the second row of pins of the housing printed circuit board is connected to the first row of pins of the harness printed circuit board. Additionally, in the second orientation, two pins of a plurality of pins, of the second row of pins, of the housing printed circuit board establish a connection with corresponding two pins of the first row of pins, of the harness printed circuit board.

In another aspect of the present disclosure, a mounting assembly for an electronic device associated with a machine is provided. The mounting assembly includes a housing printed circuit board coupled to the housing. The housing printed circuit board includes a first row of pins and a second row of pins. The mounting assembly also includes a harness for allowing interface between the electronic device and the machine. The harness is configured to be connected to the housing in a first orientation or a second orientation. The first orientation is substantially in perpendicular to the second orientation. The harness includes a harness printed circuit board having a first row of pins and a second row of pins. The harness printed circuit board is configured to connect with the housing printed circuit board, wherein the harness printed circuit board includes Ethernet receive pins and Ethernet transmit pins provided at a center position of the first row of pins and the second rows of pins, respectively, of the harness printed circuit board for maintaining electrical connectivity independent of an orientation of the harness with respect to the housing in the first orientation or the second orientation. In the first orientation, the first row of pins of the housing printed circuit board is connected to the first row of pins of the harness printed circuit board and the second row of pins of the housing printed circuit board is connected to the second row of pins of the harness printed circuit board. Further, in the first orientation, two pins of a plurality of pins, of the first row of pins, of the housing printed circuit board establish a connection with corresponding two pins of the first row of pins, of the harness printed circuit board. Additionally, in the second orientation, the first row of pins of the housing printed circuit board is connected to the second row of pins of the harness printed circuit board and the second row of pins of the housing printed circuit board is connected to the first row of pins of the harness printed circuit board. Further, in the second orientation, two pins of a plurality of pins, of the second row of pins, of the housing printed circuit board establish a connection with corresponding two pins of the first row of pins, of the harness printed circuit board.

In yet another aspect of the present disclosure, an electronic assembly associated with a machine is provided. The electronic assembly includes an electronic device interfacing with the machine. The electronic assembly also includes a housing printed circuit board. The housing printed circuit board includes a first row of pins and a second row of pins. The electronic assembly further includes a harness for allowing interface between the electronic device and the machine. The harness is configured to be connected to a housing, of the electronic device, in a first orientation or a second orientation to provide, to the electronic device, information related to the machine. The first orientation is different than the second orientation. The harness includes a harness printed circuit board having a first row of pins and a second row of pins. A plurality of pins, of the first row of pins, of the harness printed circuit board are inactive in each of the first orientation and the second orientation. The harness printed circuit board is configured to connect with the housing printed circuit board. In the first orientation, the first row of pins of the housing printed circuit board is connected to the first row of pins of the harness printed circuit board and the second row of pins of the housing printed circuit board is connected to the second row of pins of the harness printed circuit board. Further, in the first orientation, two pins of a plurality of pins, of the first row of pins, of the housing printed circuit board establish a connection with corresponding two pins of the first row of pins, of the harness printed circuit board. In the second orientation, the first row of pins of the housing printed circuit board is connected to the second row of pins of the harness printed circuit board and the second row of pins of the housing printed circuit board is connected to the first row of pins of the harness printed circuit board. Further, in the second orientation, two pins of a plurality of pins, of the second row of pins, of the housing printed circuit board establish a connection with corresponding two pins of the first row of pins, of the harness printed circuit board.

Other features and aspects of this disclosure will be apparent from the following description and the accompanying drawings.

DETAILED DESCRIPTION

Wherever possible, the same reference numbers will be used throughout the drawings to refer to the same or the like parts. Also, corresponding or similar reference numbers will be used throughout the drawings to refer to the same or corresponding parts.

Figure 1A:
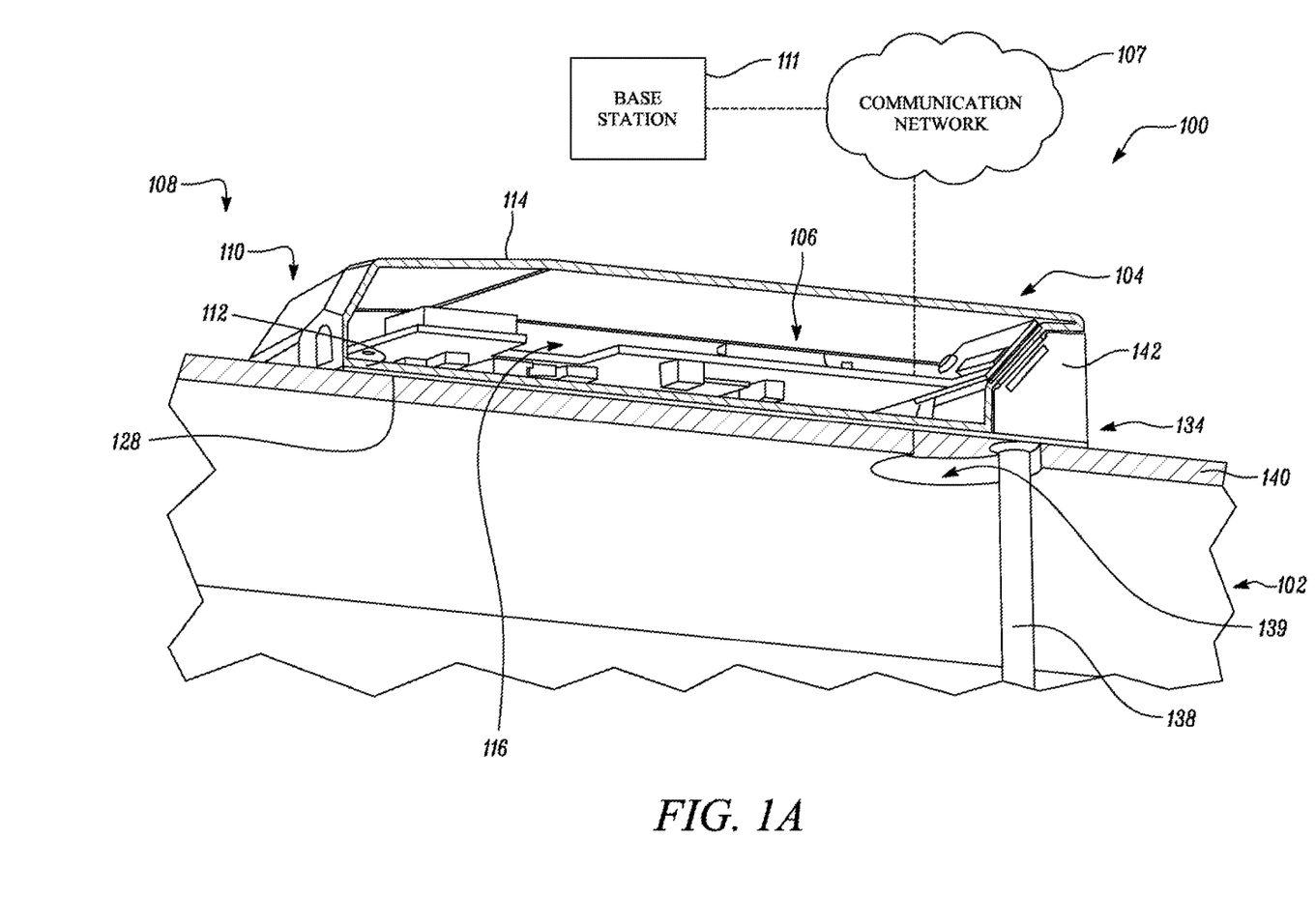
FIG. 1A is a cross-sectional view of a portion of an operator cab and an electronic assembly associated with a machine, according to some embodiments of the present disclosure.

FIG. 1A is a cross-sectional view of a portion of an operator cab 102 associated with a machine 100. When the machine 100 is a manual or a semi-autonomous machine, an operator of the machine 100 is seated within the operator cab 102 to perform one or more machine operations. The machine 100 may include, but not limited to, a stationary generator or a mobile machine, such as, a truck, a loader, an excavator, and/or the like. Further, the machine 100 can operate at any worksite, such as, a mine, a landfill, a quarry, a construction site, and/or the like. Accordingly, the machine 100 may perform operations associated with an industry such as mining, construction, farming, transportation, and/or any other industry, without any limitations.

The machine 100 includes an electronic assembly 104. In the illustrated embodiment, the electronic assembly 104 is mounted on the operator cab 102 of the machine 100. For a stationary machine, such as the stationary generator, the electronic assembly 104 may be mounted at a top portion of the stationary machine, without any limitations. The electronic assembly 104 includes an electronic device 106 that interfaces with the machine 100. In the illustrated embodiment, the electronic device 106 is a telematics device. The electronic device 106 will be hereinafter interchangeably referred to as the telematics device 106. However, it should be noted that the electronic device 106 may include any other electronic device, without limiting the scope of the present disclosure.

It should be further noted that the application of the electronic assembly 104 is not restricted to the application disclosed herein. The electronic assembly 104 can be associated with a wide variety of applications that requires mounting of an electronic device and interface of such an electronic device with another component or device, without any limitations.

Further, the telematics device 106 receives and transmits information related to the machine 100. Some of the information related to the machine 100 is received by the telematics device 106 via a harness printed circuit board 148 (of a cable 138 of a harness 134) that is connected to a housing printed circuit board 126 of the telematics device 106. The harness 134, via the cable 138, is in communication with the machine 100. In other words, the harness 134, via the cable 138, is connected to various components of the machine 100. For example, data, from various components of the machine, may be transmitted (e.g., to the telematics radio 106) via the cable 138 and the harness 134. More particularly, the harness 134 provides communication between the telematics radio 106 and the machine 100, and more particularly to a network manager 105 (shown in FIG. 4A and FIG. 4B). Further, the telematics device 106 also receives information from a base station 111, via a communication network 107 associated with the machine 100. The information received from the base station 111 may assist in operation of the machine 100. For example, the information received from the base station 111 may include steps to be followed by the machine 100 to perform a particular operation or a location at which the operation needs to be performed.

Additionally, the telematics device 106 also transmits machine related information to the base station 111. The term "machine related information" referred to herein may include any information related to the machine 100 that may assist the operator or a maintenance personnel with respect to operation and/or maintenance of the machine 100. For example, the machine related information may include machine location, outputs from various sensors associated with the machine 100, fuel level of the machine 100, information regarding engine condition or engine operating hours, and/or the like. The telematics device 106 interfaces with the network manager 105 associated with the machine 100. The network manager 105 may be mounted on the machine 100 and may store or process information related to the machine 100, without limiting the scope of the present disclosure. It should be noted that the network manager 105 may include a Machine Control Unit (MCU) of the machine 100. For example, the network manager 105 may receive values of one or more operational parameters of the machine 100 from sensors associated with the machine 100. In some embodiments, the operational parameters may include speed of the machine 100, a heading direction and a location of the machine 100, temperature of various components, such as an engine, of the machine 100, and/or the like. Additionally, the network manager 105 may store the values in a memory of the network manager 105 and process these values to control one or more operations of the machine 100.

The telematics device 106 includes various components (not shown), such as, a transceiver, a memory, a cellular radio, a satellite radio, and/or a Global Positioning System (GPS) module. Additionally, the telematics device 106 includes a control unit 109 (shown in FIGS. 4A and 4B). The control unit 109 is mounted within a mounting assembly 108. The control unit 109 may receive machine related information from the network manager 105, via the housing printed circuit board 126 and the harness printed circuit board 148. A controller 115 (shown in FIGS. 4A and 4B) is included in the control unit 109. Further, the transceiver of the telematics device 106 may transmit and receive location-based data generated by the GPS module and/or the information related to the machine 100. The cellular radio is used when the machine 100 is operating in an area with a cellular network. Whereas, the satellite radio is used when cellular network is not available in the area of operation of the machine 100. In such cases, the satellite radio allows communication over a satellite. Further, the GPS module may transmit and receive location signals from external sources, such as, a GPS.

The telematics device 106 is mounted on the machine 100 using the mounting assembly 108. The mounting assembly 108 includes a housing 110. In some embodiments, the housing 110 is generally rectangular in shape. Alternatively, the housing 110 may include any other shape, without limiting the scope of the present disclosure. Further, the housing 110 includes a base plate 112 and a cover 114. The base plate 112 and the cover 114 extend along a first axis X-X' (shown in FIG. 2A) defined by the housing 110. The housing 110 includes an interior space 116 that receives and encloses one or more components of the telematics device 106. More particularly, the components of the telematics device 106 are supported on the base plate 112 and are enclosed for protection by the cover 114 of the housing 110.

The mounting assembly 108 is positioned on a roof 140 of the operator cab 102. In some embodiments, the mounting assembly 108 can be coupled to the roof 140 of the operator cab 102 using adhesives. More particularly, a bottom surface of the base plate 112 of the housing 110 may include a double sided adhesive tape 128 in order to couple the mounting assembly 108 with the roof 140. Further, an aperture 139 in the roof 140 through which the cable 138 of the harness 134 exits the operator cab 102 is sealed by an appropriate sealing member to inhibit entry of moisture or other foreign material into the operator cab 102.

In some embodiments, the mounting assembly 108 can be coupled to the roof 140 of the operator cab 102 using mechanical fastening methods. For example, mechanical fasteners, such as bolts, screws, pins, rivets, and/or the like may be used. The mounting assembly 108 can also be coupled to the operator cab 102 using other joining techniques such as welding, soldering, brazing, and/or the like. In some embodiments, the mounting assembly 108 can be hard mounted to the roof 140 of the operator cab 102. For hard mounting, the mounting assembly 108 may be attached to a plate (not shown) having a through-hole that can be threaded into the roof 140 of the operator cab 102.

Further, the harness 134 of the mounting assembly 108 allows interface between the telematics device 106 and the machine 100. More particularly, the harness 134 provides communication between the telematics device 106 with the network manager 105. The harness 134 is connected to a power source 113 (shown in FIGS. 4A and 4B) of the machine 100 to power the telematics device 106. In some embodiments, the power source 113 is located on the machine 100 and may include a source of electric power that powers the telematics device 106. The harness 134 can be coupled to the housing 110 in a first orientation or a second orientation. The first orientation is substantially in perpendicular to the second orientation. In the first orientation, the harness 134 exits the housing 110 from a bottom portion 136 (shown in FIG. 2A) of the housing 110 and the cable 138 of the harness 134 extends substantially in perpendicular with respect to the first axis X-X', so that the cable 138 of the harness 134 can be vertically received through the aperture 139 provided in the roof 140 of the operator cab 102. In some embodiments, the cable 138 may be an electrically conductive cable that includes a number of wires. The connection of the harness 134 to the housing 110 in the first orientation will be explained in detail below with respect to FIGS. 2A, 3A, and 4A.

Figure 1B:
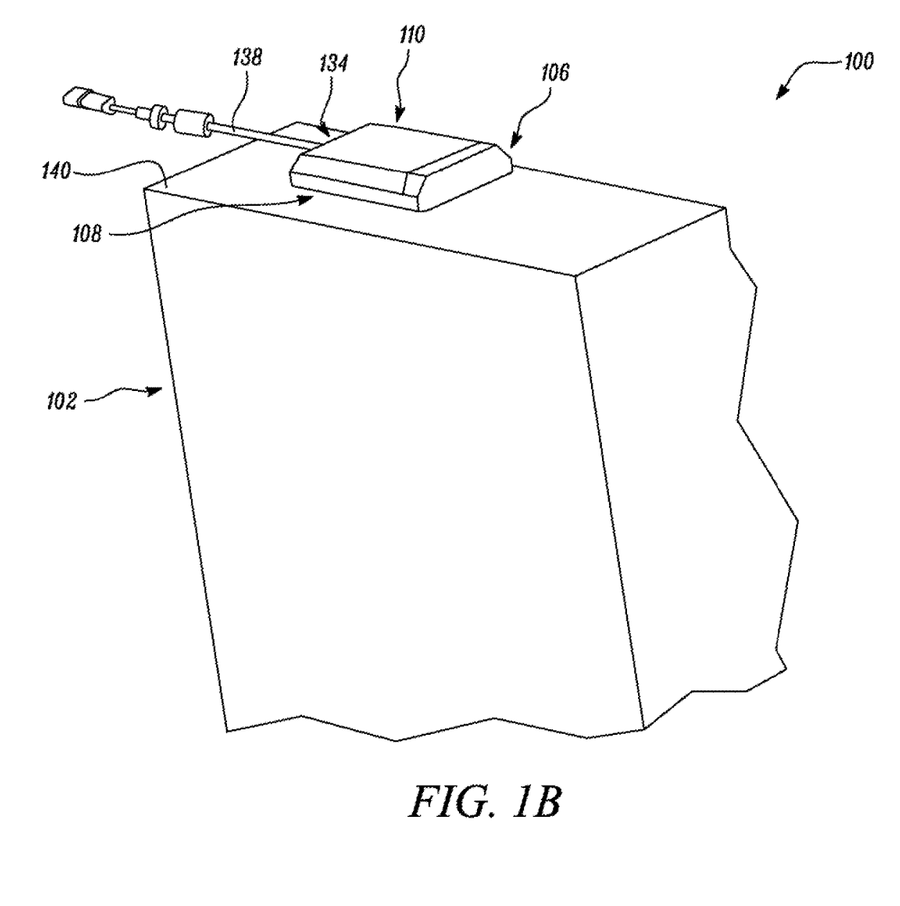
FIG. 1B is a cross-sectional view of a portion of the operator cab and the electronic assembly illustrating a harness coupled with a housing in a second orientation.
Figure 2A:
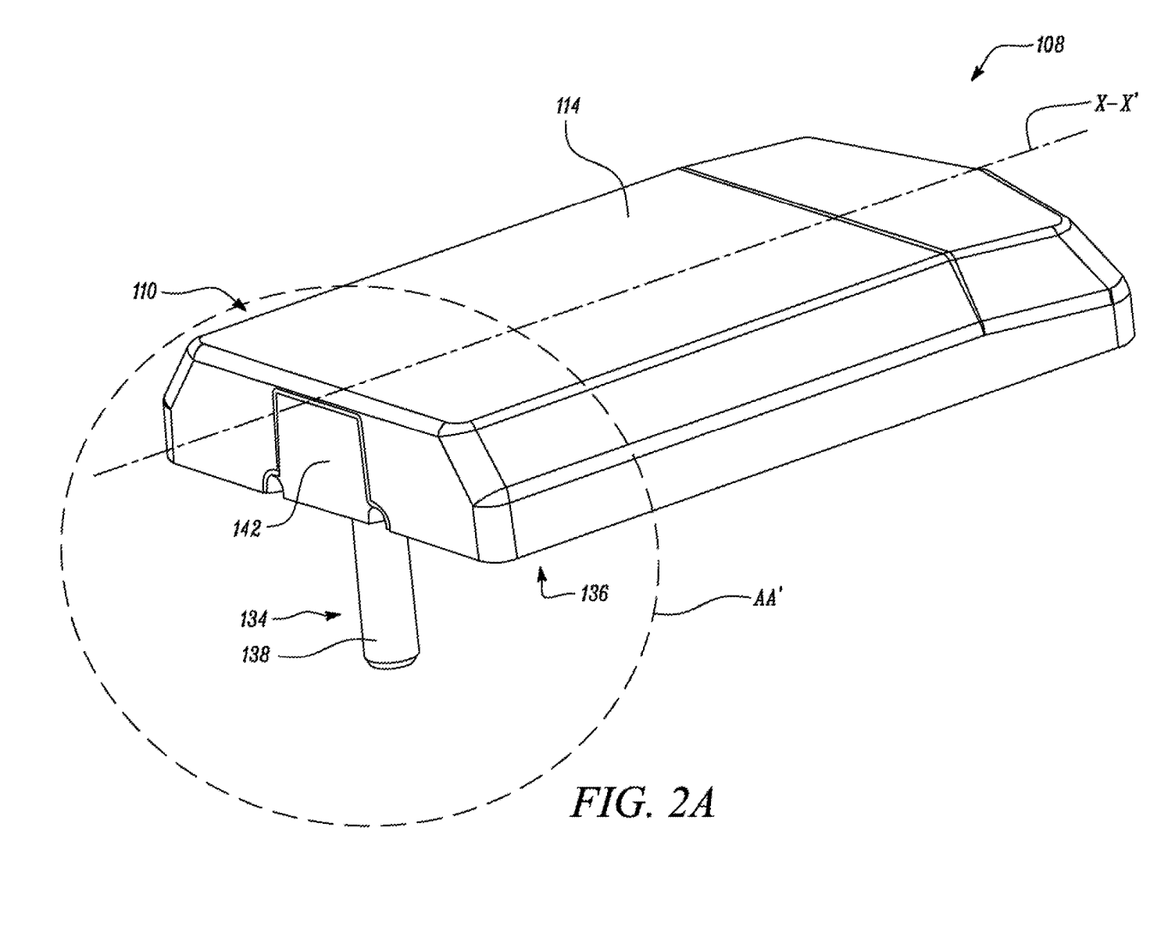
FIG. 2A is a perspective view of a mounting assembly illustrating the harness coupled with a housing of the mounting assembly in a first orientation.
Figure 2B:
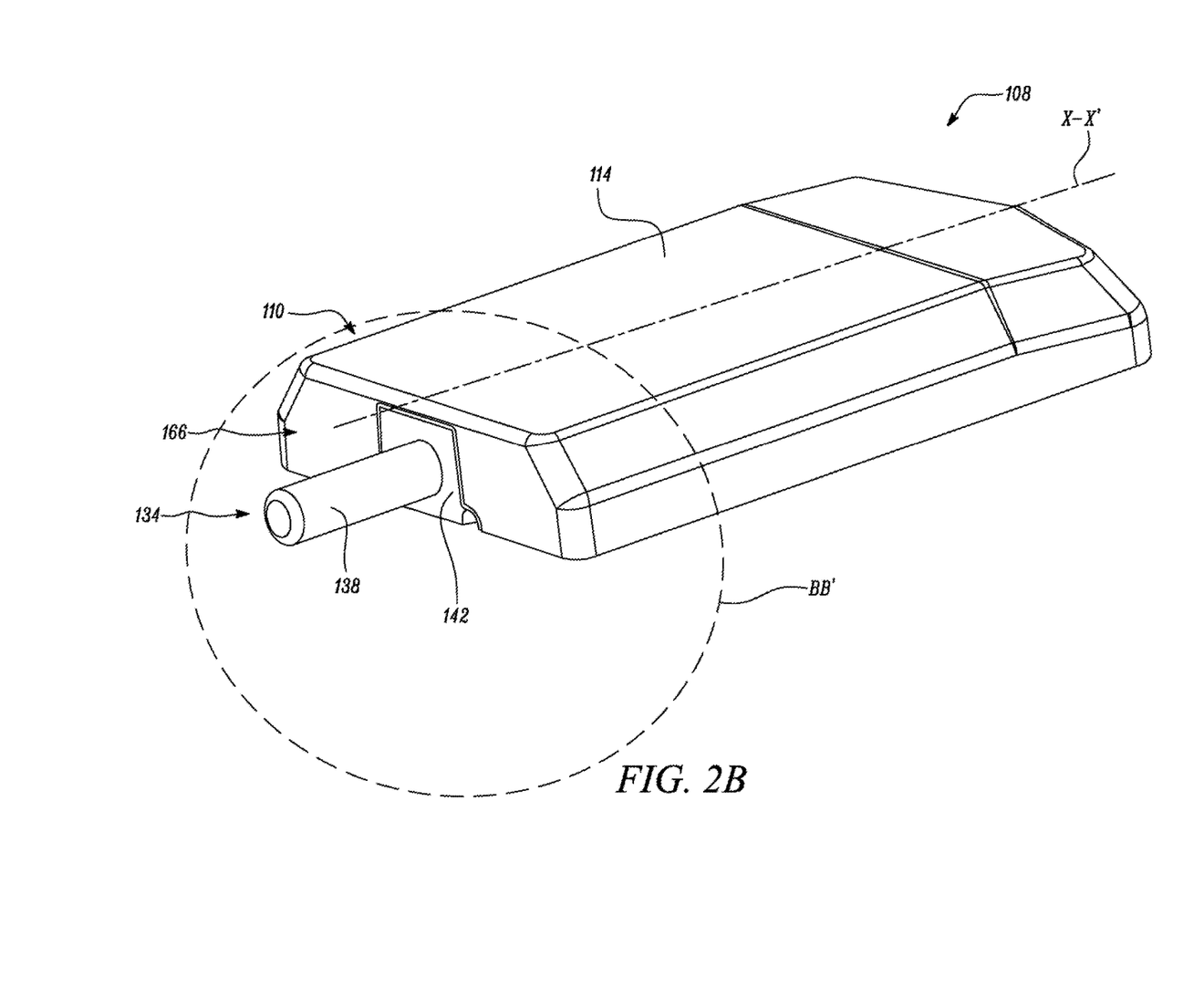
FIG. 2B is a perspective view of the mounting assembly illustrating the harness coupled with the housing in the second orientation.

Referring now to FIG. 1B, in the second orientation, the harness 134 exits the housing 110 from a side portion 166 (shown in FIG. 2B) of the housing 110, such that the cable 138 extends substantially in parallel with respect to the first axis X-X' (shown in FIG. 2B). The connection of the harness 134 to the housing 110 in the second orientation will be explained in detail below with respect to FIGS. 2B, 3B, and 4B.

Figure 3A:
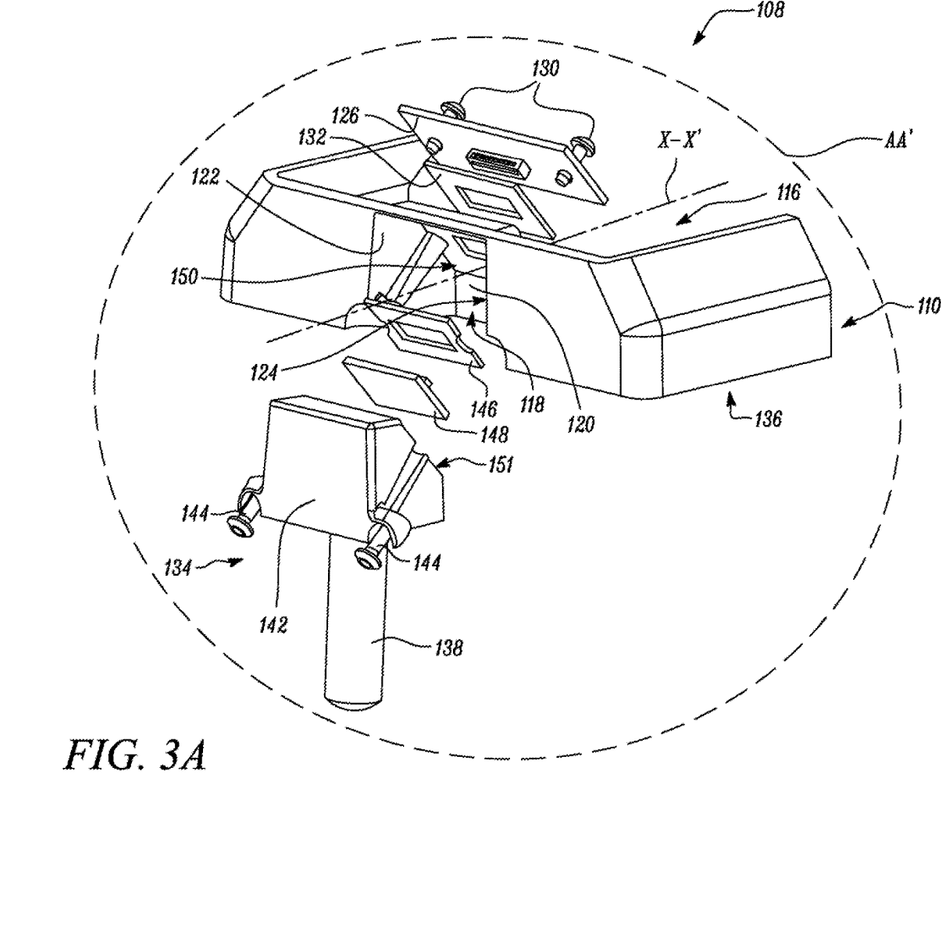
FIG. 3A is an exploded view of an encircled portion AA' of the mounting assembly shown in FIG. 2A.
Figure 3B:
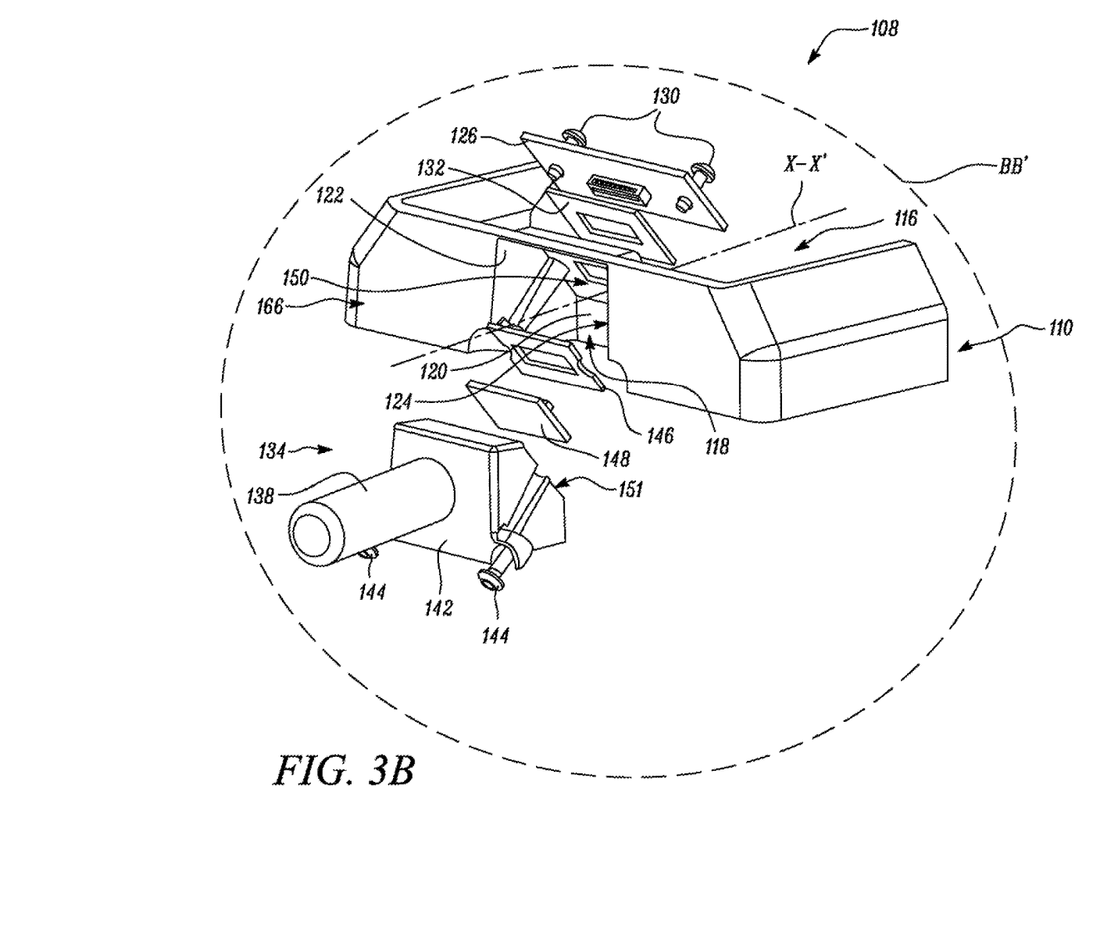
FIG. 3B is an exploded view of an encircled portion BB' of the mounting assembly shown in FIG. 2B.

Referring now to FIGS. 2A and 2B, one end of the cable 138 includes a connecting member 142. The connecting member 142 is received within an external enclosure 118 (shown in FIGS. 3A and 3B) of the housing 110 when the harness 134 is coupled with the housing 110 in the first or second orientations. Details of the mounting assembly 108 will now be explained with reference to FIG. 3A and FIG. 3B. FIG. 3A is an exploded view of an encircled portion AA' shown in FIG. 2A for connecting the harness 134 in the first orientation. Additionally, FIG. 3B is an exploded view of an encircled portion BB' shown in FIG. 2B for connecting the harness 134 in the second orientation. Referring now to FIGS. 3A and 3B, the connecting member 142 is removably coupled with the housing 110 using mechanical fasteners 144. A first wall 120 of the external enclosure 118 includes apertures (not shown) that are aligned with apertures (not shown) provided in the connecting member 142 to receive the mechanical fasteners 144. The mechanical fasteners 144 may include any one of a bolt, a pin, a rivet, a screw, and/or the like.

The mounting assembly 108 also includes the external enclosure 118. The external enclosure 118 is defined by the first wall 120, a second wall 122, and a third wall 124 of the housing 110. Further, the housing printed circuit board 126 is coupled to an inner surface (not shown) of the first wall 120 of the housing 110. The housing printed circuit board 126 is in communication with the control unit 109 (shown in FIGS. 4A and 4B). The housing printed circuit board 126 will be explained in detail below with respect to FIGS. 4A and 4B. The housing printed circuit board 126 is coupled to the inner surface using mechanical fasteners 130. The first wall 120 includes apertures (not shown) that are aligned with apertures (not shown) provided in the housing printed circuit board 126 to receive the mechanical fasteners 130. The mechanical fasteners 130 may include any one of a bolt, a pin, a rivet, a screw, and/or the like. Further, a first gasket 132 is positioned between the inner surface and the housing printed circuit board 126, when the housing printed circuit board 126 is coupled with the first wall 120.

The harness 134 also includes a second gasket 146 and the harness printed circuit board 148. The harness printed circuit board 148 is in communication with the control unit 109. The harness printed circuit board 148 will be explained in detail below with respect to FIGS. 4A and 4B. When the harness 134 is coupled with the housing 110, the second gasket 146 is positioned between an outer surface 150 of the first wall 120 and the harness printed circuit board 148. It should be noted that the outer surface 150 is positioned on an opposite face of the inner surface. In some embodiments, the harness printed circuit board 148 can be coupled to a surface 151 of the connecting member 142 using mechanical fasteners. Additionally, or alternatively, adhesives may be used to couple the harness printed circuit board 148 with the connecting member 142.

Referring now specifically to FIG. 3A, for coupling of the harness 134 in the first orientation, the harness 134 is positioned such that the cable 138 extends substantially perpendicularly with respect to the first axis X-X' and the surface 151 of the connecting member 142 faces the outer surface 150 of the first wall 120. Further, the apertures of the connecting member 142 are aligned with the apertures of the first wall 120 to receive the mechanical fasteners 144 for removably coupling the connecting member 142 with the housing 110.

When the orientation of the harness 134 is to be changed from the first orientation to the second orientation, the mechanical fasteners 144 are removed so that the connecting member 142 can be removed from the external enclosure 118 of the housing 110. The harness 134 is then rotated by an angle of 180 degrees in a clockwise direction or a counter-clockwise direction, such that the cable 138 extends substantially in parallel with respect to the first axis X-X'. Referring now specifically to FIG. 3B, for coupling of the harness 134 in the second orientation, the harness 134 is positioned such that the cable 138 extends substantially in parallel with respect to the first axis X-X' and the surface 151 of the connecting member 142 faces the outer surface 150 of the first wall 120. Further, the apertures of the connecting member 142 are aligned with the apertures of the first wall 120 to receive the connecting member 142 within the external enclosure 118. The mechanical fasteners 144 are then inserted into the apertures of the connecting member 142 and the first wall 120, respectively, for coupling the connecting member 142 with the housing 110 in the second orientation.

The housing printed circuit board 126 will now be explained in detail below with respect to FIGS. 4A and 4B. The housing printed circuit board 126 includes a first row of pins 158 and a second row of pins 160. In some embodiments, each of the first row of pins 158 and the second row of pins 160 includes thirty pins. It should be noted that the pins, of the first row of pins 158, are arranged in a particular order. Further, the pins, of the second row of pins 160, are arranged in a reverse order with respect to the particular order of the first row of pins 158. Additionally, a type of the pins, of the first row of pins 158, is same as a type of the pins, of the second row of pins 160. It should be further noted that a number of the pins, of the first row of pins 158, are same as a number of the pins, of the second row of pins 160. Further, the thirty pins in the first row of pins 158 and the thirty pins in the second row of pins 160 are substantially the same. For example, each of the first row of pins 158 and the second row of pins 160 may include a pin for connecting to a power source, a pin for connecting to ground, and a pin for receiving commands for wake up. Each of the first row of pins 158 and the second row of pins 160 may also include pins for connecting to a battery backup. Further, each of the first row of pins 158 and the second row of pins 160 may include pins for connecting to Control Area Network (CAN) buses, pins for connecting to a serial communication ports, and/or the like. The first and the second rows of pins 158, 160 may also include a number of spare pins and communication pins apart from the above mentioned pins.

Further, the first row of pins 158 and the second row of pins 160 include Ethernet pins 168, 170, respectively, having positive and negative polarity. The Ethernet pins 168, 170 are associated with 4-wire Ethernet, and are placed at a center position of the first row of pins 158 and the second row of pins 160 (e.g., in a center position of the particular order and the reverse order). It should be noted that the controller 115 (e.g., Ethernet controller), included in the control unit 109 of the machine 100, is configured to selectively assign the Ethernet pins 168, 170 of the housing printed circuit board 126 as Ethernet receive pins or Ethernet transmit pins based on the coupling of the harness 134 in the first orientation or the second orientation. More specifically, the controller 115 queries the network manager 105 via the housing printed circuit board 126 and the harness printed circuit board 148 to determine which of the Ethernet pins 168, 170 should be assigned as the Ethernet receive pins or the Ethernet transmit pins. More particularly, the controller 115 detects the coupling of the harness 134 in the first orientation or the second orientation and also detects the communication (e.g., data communication) between the housing printed circuit board 126 and the harness printed circuit board 148 with the control unit 109. The controller 115 establishes data communication with the network manager 105, via the housing printed circuit board 126 to detect which of the Ethernet pins 168, 170 are assigned as the Ethernet receive pins or the Ethernet transmit pins. Further, the controller 115 establishes data communication with the network manager 105, via the harness printed circuit board 148 to detect which of the Ethernet receive pins 162 or Ethernet transmit pins 164 establish a connection with the Ethernet pins 168, 170 of the housing printed circuit board 126. Based on querying the network manager 105 and the orientation of the harness 134, the controller 115 selectively assigns the Ethernet pins 168, 170 as the Ethernet receive pins or the Ethernet transmit pins. For example, when the controller 115 detects that the Ethernet pins 168 of the housing printed circuit board 126 establishes a connection with the Ethernet receive pins 162 of the harness printed circuit board 148 in the first orientation, the controller 115 assigns the Ethernet pins 168 as Ethernet receive pins. Further, when the controller 115 detects that the Ethernet pins 168 of the housing printed circuit board 126 establishes a connection with the Ethernet transmit pins 164 harness printed circuit board 148 in the second orientation, the controller 115 assigns the Ethernet pins 168 as Ethernet transmit pins. As used herein, "establish a connection" may refer to establishing an electrical connection and/or a data connection. For example, pins may be physically connected without establishing a connection (for instance, when the pins are inactive).

Accordingly, in some embodiments, when the harness 134 is coupled in the first orientation, the Ethernet pins 168 of the first row of pins 158 are assigned, by the controller 115, as the Ethernet receive pins and the Ethernet pins 170 of the second row of pins 160 are assigned, by the controller 115, as the Ethernet transmit pins. Further, when the harness 134 is coupled in the second orientation, the Ethernet pins 168 on the first row of pins 158 are assigned, by the controller 115, as the Ethernet transmit pins and the Ethernet pins 170 of the second row of pins 160 are assigned, by the controller 115, as the Ethernet receive pins.

It should be noted that all the pins of the first row of pins 158 and the second row of pins 160 are active in each of the first orientation and the second orientation. More specifically, the connection of the harness printed circuit board 148 with the housing printed circuit board 126 in the first orientation and the connection of the harness 134 with the power source 113 complete an electric circuit for the first orientation while disconnecting an electric circuit for the second orientation. Additionally, the connection of the harness printed circuit board 148 with the housing printed circuit board 126 in the second orientation and the connection of the harness 134 with the power source 113 complete the electric circuit for the second orientation while disconnecting the electric circuit for the first orientation. Thus, the completion of the electric circuit is based on the connection of the housing printed circuit board 126 with the harness printed circuit board 148 and the connection of the harness 134 with the power source 113.

In some embodiments, when the harness 134 is coupled in the first orientation, only two pins (and more particularly the Ethernet pins 168, of the first row of pins 158) establish the connection with the corresponding Ethernet receive pins 162 of the first row of pins 154 while the remaining 28 pins of the first row of pins 158 do not establish any connection with the remaining pins of the first row of pins 154 because the remaining pins of the first row of pins 154 are inactive. Additionally, each of the thirty pins of the second row of pins 160 establish a connection with the thirty pins on the second row of pins 156 to complete the electric circuit in the first orientation. Thus, in the first orientation, the electric circuit is established based on the connection established between the Ethernet pins 168 with the Ethernet receive pins 162, the connection established between the second row of pins 160 with the second row of pins 156, respectively, the connection of the harness 134 with the power source 113, and the communication between the controller 115 and the network manager 105.

When the harness 134 is connected in the second orientation, each of the thirty pins of the first row of pins 158 establish a connection with thirty pins of the second row of pins 156. Additionally, only two pins, and more particularly, the Ethernet pins 170, of the second row of pins 160 establish a connection with the Ethernet receive pins 162 of the first row of pins 154. Thus, in the second orientation, the electric circuit is established (or created) based on the connection established between the Ethernet pins 170 with the Ethernet receive pins 162, the connection established between the first row of pins 158 with the second row of pins 156, respectively, the connection of the harness 134 with the power source 113, and the communication between the controller 115 and the network manager 105.

Further, as mentioned earlier, the harness printed circuit board 148 is adapted to connect with the housing printed circuit board 126 to provide communication between the telematics device 106 and the machine 100 (or connect the telematics device 106 to the machine 100). The harness printed circuit board 148 includes pins 152 that are configured in such a way that the harness 134 can be connected to the housing 110 in the first orientation or the second orientation (to connect the telematics device 106 to the machine 100). The harness printed circuit board 148 includes the first row of pins 154 and the second row of pins 156. It should be noted that the pins 152 of the harness printed circuit board 148 can be connected with the power source 113 via the harness 134 (see FIGS. 3A and 3B) to establish the electric circuit in the first orientation or the second orientation.

The first row of pins 154 includes thirty pins. Further, the first row of pins 154 includes two active pins and the remaining 28 pins of the first row of pins 154 are inactive in both the first orientation and the second orientation. The two active pins are the Ethernet receive pins 162 with positive and negative polarity. The two active Ethernet receive pins 162 of the first row of pins 154 are positioned at a center position of the first row of pins 154.

In some embodiments, the second row of pins 156 includes thirty pins. The second row of pins 156 is arranged such that the two Ethernet transmit pins 164 of the second row of pins 156 are positioned at a center position of the second row of pins 156. The two Ethernet transmit pins 164 have positive and negative polarity. It should be noted that the Ethernet receive and transmit pins 162, 164 are placed at the center position of the first row of pins 154 and the second row of pins 156 of the harness printed circuit board 148 to maintain electrical connectivity of the harness printed circuit board 148 with the housing printed circuit board 126, independent of the orientation of the harness 134 with respect to the housing 110 in the first or second orientations. Thus, the harness printed circuit board 148 is configured such that the harness printed circuit board 148 maintains pin connections that are defined by an electrical schematic with the housing printed circuit board 126 in each of the first orientation and the second orientation. In some embodiments, the term "electric schematic" mentioned herein indicates an order in which the pins of the housing printed circuit board 126 and the harness printed circuit board 148 need to be connected for establishing the electric circuit in the first orientation and/or the second orientation. For example, irrespective of the orientation of the coupling of the harness 134, the Ethernet transmit pins 164 on the harness printed circuit board 148 will always establish a connection with one of the pair of Ethernet pins 168, 170 that are assigned as the Ethernet transmit pins on the housing printed circuit board 126, the Ethernet receive pins 162 on the harness printed circuit board 148 establish a connection with one of the pair of Ethernet pins 168, 170 that are assigned as the Ethernet receive pins on the housing printed circuit board 126, and/or the like.

Further, the second row of pins 156 may include a pin for connecting to the power source 113, a pin for connecting to ground, and a pin for receiving commands for wake up. The second row of pins 156 may additionally include pins for connecting to a battery backup. The second row of pins 156 may include pins for connecting to CAN buses, pins for connecting to a serial communication ports, and/or the like.

The second row of pins 156 may additionally include a number of spare pins and communication pins apart from the above mentioned pins.

Figure 4A:
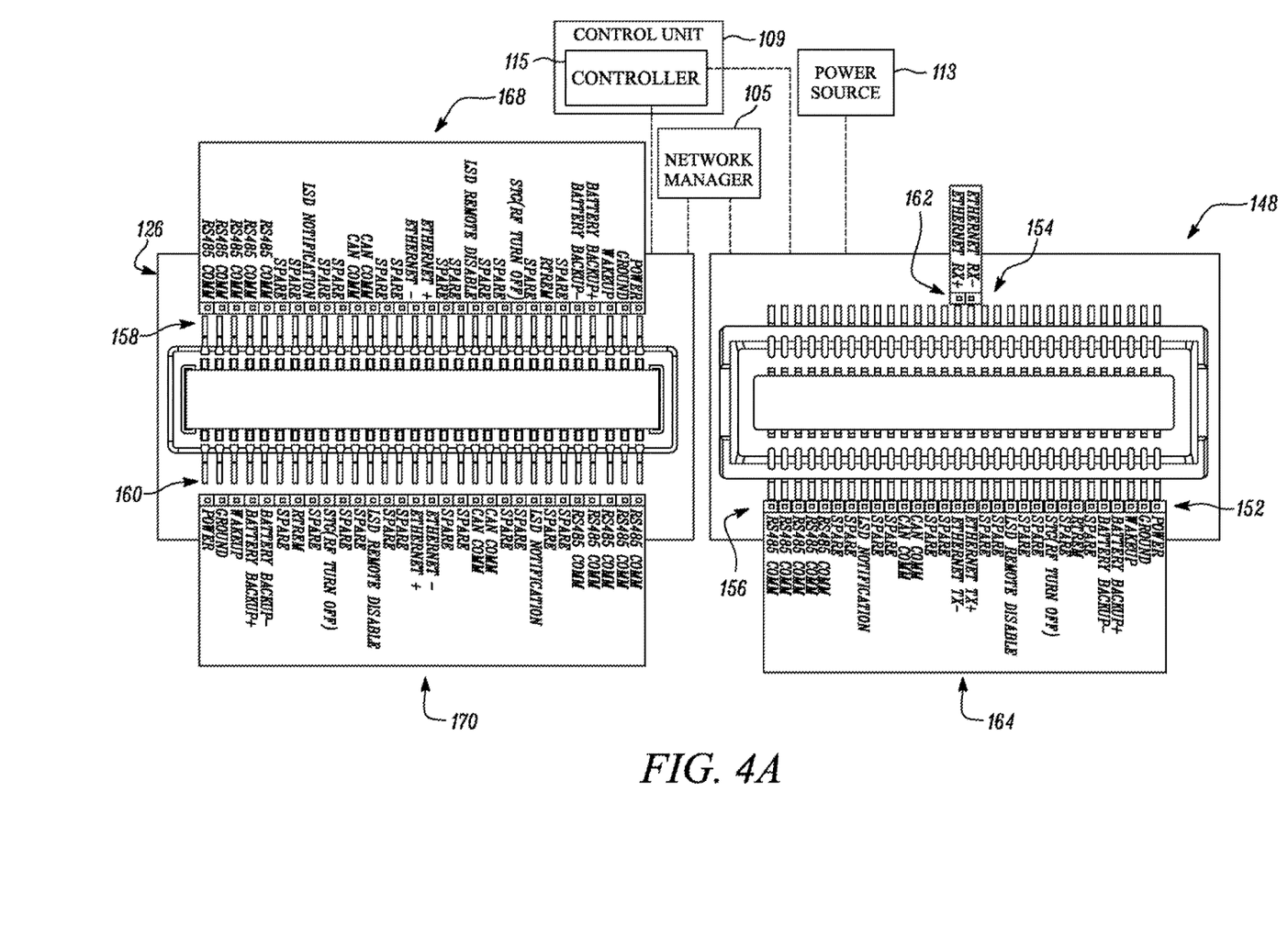
FIG. 4A is a schematic view of a housing printed circuit board of the mounting assembly for connection with a harness printed circuit board of the mounting assembly in the first orientation.

Referring now specifically to FIG. 4A, in the first orientation, the first row of pins 154 of the harness printed circuit board 148 connect to the first row of pins 158 of the housing printed circuit board 126. In the first orientation, the Ethernet receive pins 162 of the first row of pins 154 of the harness printed circuit board 148 establish the connection with the Ethernet pins 168 (that are assigned as the Ethernet receive pins by the controller 115) of the first row of pins 158 of the housing printed circuit board 126 to establish the electric circuit in the first orientation. Thus, in the first orientation, only the Ethernet pins 168 of the first row of pins 158 of the housing printed circuit board 126 are used to establish the electric circuit and the remaining 28 pins of the first row of pins 158 do not establish any connection with any pins of the first row of pins 154. In the first orientation, the Ethernet pins 168 of the first row of pins 158 and each pin of the second row of pins 160 of the housing printed circuit board 126 are used to establish (or create) the electric circuit as the harness printed circuit board 148 establishes the connection with the housing printed circuit board 126 and the harness 134 is connected with the power source 113.

It should be noted that, in the first orientation, the two pins of the first row of pins 154 that are positioned at the center position of the harness printed circuit board 148 (i.e., the Ethernet receive pins 162) establish the connection with the corresponding pins that are positioned at the center position of the first row of pins 158 of the housing printed circuit board 126 (i.e., Ethernet pins 168), that are assigned as the Ethernet receive pins by the controller 115. Accordingly, a 2-pin connection is established between the first row of pins 154 of the harness printed circuit board 148 and the first row of pins 158 of the housing printed circuit board 126. In this regard, a number of pins (e.g., a majority) of each of the first row of pins 154 and the first row of pins 158 do not establish any connection with each other for establishing the electric circuit in the first orientation.

It should be noted that the placement of the Ethernet receive pins 162 at the center position of the harness printed circuit board 148 and the Ethernet pins 168 at the center position of the housing printed circuit board 126, respectively, allows a 32-pin connection to be established between the harness printed circuit board 148 and the housing printed circuit board 126 without establishing any connection between the remaining 28 pins of each of the harness printed circuit board 148 and the housing printed circuit board 126.

In the first orientation, the second row of pins 160 of the housing printed circuit board 126 connect to the second row of pins 156 of the harness printed circuit board 148. More particularly, the thirty pins of the second row of pins 160 of the housing printed circuit board 126 establish the connection with the corresponding thirty pins of the second row of pins 156 of the harness printed circuit board 148, thereby establishing a 30-pin connection between the second row of pins 160 of the housing printed circuit board 126 and the second row of pins 156 of the harness printed circuit board 148.

It should be noted that the Ethernet pins 170, that are assigned as the Ethernet transmit pins by the controller 115 and are positioned at the center position of the second row of pins 160, establish the connection with the corresponding Ethernet transmit pins 164 that are positioned at the center position of the second row of pins 156. Additionally, the pin for activating the housing printed circuit board 126 provided on the second row of pins 160 connects with the corresponding pin that connects to the power source 113 provided on the second row of pins 156, the pin for connecting to the ground provided on the second row of pins 160 connects with the corresponding pin for connecting to the ground provided on the second row of pins 156, and the pin for receiving commands for wake up provided on the second row of pins 160 connects with the corresponding pin for receiving commands for wake up provided on the second row of pins 156. Additionally, the pins for connecting to the battery backup provided on the second row of pins 160 connects with the corresponding pins for connecting to the battery backup provided on the second row of pins 156. Further, the pins for connecting to the CAN buses provided on the second row of pins 160 connects with the corresponding pins for connecting to the CAN buses provided on the second row of pins 156, the pins for connecting to the serial communication ports provided on the second row of pins 160 connects with the corresponding serial communication ports provided on the second row of pins 156. Further, the remaining communication pins provided on the second row of pins 160 connects with the corresponding communication pins provided on the second row of pins 156. Thus, in the first orientation, the 32-pin connection is established between the harness printed circuit board 148 and the housing printed circuit board 126 based on connecting the first row of pins 154 to the first row of pins 158 and connecting the second row of pins 156 to the second row of pins 160.

Figure 4B:
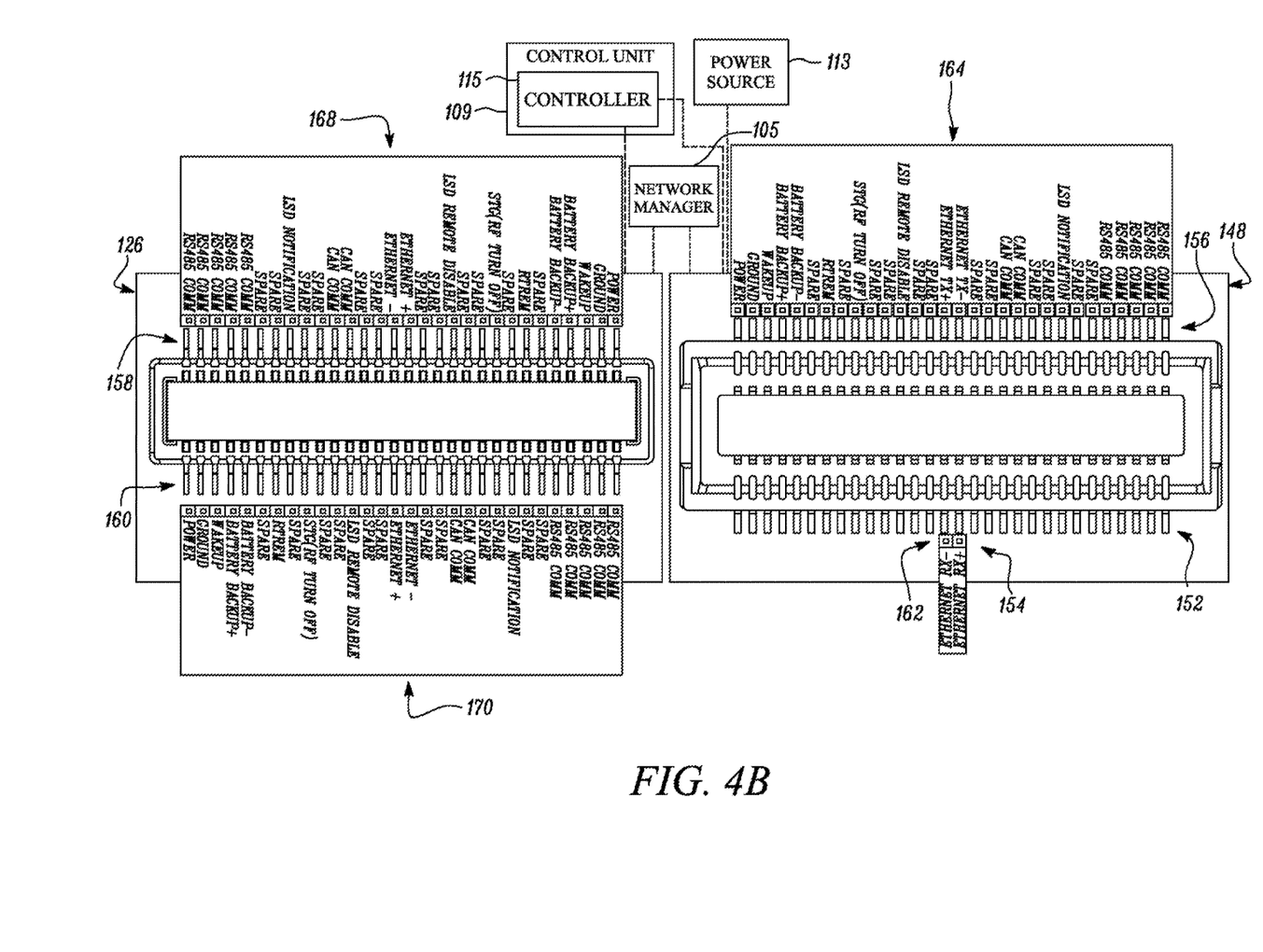
FIG. 4B is a schematic view of the housing printed circuit board for connection with the harness printed circuit board in the second orientation.

Referring now specifically to FIG. 4B, in the second orientation, the first row of pins 158 of the housing printed circuit board 126 connects with the second row of pins 156 of the harness printed circuit board 148 and the second row of pins 160 of the housing printed circuit board 126 connects with the first row of pins 154 of the harness printed circuit board 148. Further, a number of pins of each of the first row of pins 154 and the second row of pins 160 are not used to establish the electric circuit in the second orientation. In the second orientation, the Ethernet receive pins 162 of the first row of pins 154 of the harness printed circuit board 148 establish the connection with the Ethernet pins 170 of the second row of pins 158 of the housing printed circuit board 126 to complete the electric circuit in the second orientation. Thus, in the second orientation, only the Ethernet pins 170 of the second row of pins 160 of the housing printed circuit board 126 are used to establish the electric circuit and the remaining 28 pins of the second row of pins 160 do not establish any connection with any pins of the first row of pins 154. Further, the Ethernet pins 170 of the second row of pins 160 and each pin of the first row of pins 158 of the housing printed circuit board 126 are used to establish the electric circuit in the second orientation as the harness printed circuit board 148 is connected to the housing printed circuit board 126 and the harness 134 is connected to the power source 113.

It should be noted that, in the second orientation, the thirty pins of the first row of pins 158 of the housing printed circuit board 126 connect to the corresponding thirty pins of the second row of pins 156 of the harness printed circuit board 148, thereby establishing a 30-pin connection between the first row of pins 158 of the housing printed circuit board 126 and the second row of pins of 156 the harness printed circuit board 148. More particularly, the pin for activating the housing printed circuit board 126 provided on the first row of pins 158 connects with the corresponding pin for connecting to the power source 113 provided on the second row of pins 156, the pin for connecting to the ground provided on the first row of pins 158 connects with the corresponding pin for connecting to the ground provided on the second row of pins 156, and the pin for receiving commands for wake up provided on the first row of pins 158 connects with the corresponding pin for receiving commands for wake up provided on the second row of pins 156. Additionally, the pins for connecting to the battery backup provided on the first row of pins 158 connects with the corresponding pins for connecting to the battery backup provided on the second row of pins 156. Further, the pins for connecting to the CAN buses provided on the first row of pins 158 connects with the corresponding pins for connecting to the CAN buses provided on the second row of pins 156, the pins for connecting to the serial communication ports provided on the first row of pins 158 connects with the corresponding serial communication ports provided on the second row of pins 156. Further, the remaining communication pins provided on the first row of pins 158 connects with the corresponding communication pins provided on the second row of pins 156. Additionally, the Ethernet pins 168, that are assigned as the Ethernet transmit pins by the controller 115 of the control unit 109 and are positioned at the center position of the second row of pins 160, establish the connection with the corresponding transmit pins 164 that are positioned at the center position of the first row of pins 156.

Further, in the second orientation, the second row of pins 160 of the housing printed circuit board 126 connect to the first row of pins 154 of the harness printed circuit board 148. More particularly, the two pins of the first row of pins 154 of the harness printed circuit board 148 (i.e., the Ethernet receive pins 162) establish the connection with the corresponding pins of the second row of pins 160 positioned at the center position of the housing printed circuit board 126 (i.e., Ethernet pins 170), that are assigned as the Ethernet receive pins by the controller 115. Accordingly, a 2-pin connection is established between the first row of pins 154 of the harness printed circuit board 148 and the second row of pins 160 of the housing printed circuit board 126.

It should be noted that the placement of the Ethernet receive pins 162 and the Ethernet pins 170 at the center position of the harness and housing printed circuit board 148, 126, respectively, allows a 32-pin connection to be established between the harness and the housing printed circuit board 148, 126 without establishing any connection between the remaining 28 pins on each of the harness printed circuit board 148 and the housing printed circuit board 126. Thus, in the second orientation, the 32-pin connection is established between the housing printed circuit board 126 and the harness printed circuit board 148 based on connecting the first row of pins 158 to the second row of pins 156 and the second row of pins 160 to the first row of pins 154.

INDUSTRIAL APPLICABILITY

The present disclosure relates to the mounting assembly 108 associated with the machine 100. The mounting assembly 108 disclosed herein allows easy switching of the harness 134 between the first orientation and the second orientation, based on mounting requirements of the machine 100. Accordingly, the mounting assembly 108 can be used to mount the electronic device 106 on machines having different mounting requirements.

The harness printed circuit board 148 and the housing printed circuit board 126 of the mounting assembly 108 is configured such that the interface between the electronic device 106 and the machine 100 is maintained in both the first orientation and the second orientation. The harness printed circuit board 148 includes the first row of pins 154 and the second row of pins 156. The first row of pins 154 includes thirty active pins including Ethernet receive pins 162 that are placed at the center position of the first row of pins 154. Additionally, the second row of pins 156 includes two active Ethernet transmit pins 164 that are placed at the center position of the second row of pins 156 whereas the remaining 28 pins of the second row of pins 156 are always inactive. Further, the housing printed circuit board 126 includes the first row of pins 158 and the second row of pins 160. Each of the pins of the first row of pins 158 and the second row of pins 160 are active pins. Additionally, each of the first row of pins 158 and the second row of pins 160 include Ethernet pins 168, 170 that are placed at the center position of the first row of pins 158 and the second row of pins 160, respectively. Thus, the arrangement of the pins on each of the housing printed circuit board 126 and the harness printed circuit board 148 allow the harness 134 to be connected in any of the first orientation or the second orientation. More particularly, the harness printed circuit board 148 or the housing printed circuit board 126 do not require any dedicated electronics to allow the switching of the harness orientation between the first orientation and the second orientation, thereby providing an electronic assembly that is simple to configure.

Further, the orientation of the harness 134 can be changed between the first orientation and the second orientation by simply re-orienting the connecting member 142, without changing any hardware of the electronic assembly 104. The components of the mounting assembly 108 are simple to design and manufacture, and are cost effective. Further, the mounting assembly 108 can be retrofitted on a machine in field by customers of the machine by replacing an existing mounting assembly with the mounting assembly 108, during servicing of the machine. The mounting assembly 108 disclosed herein consolidates multiple part numbers associated with the mounting assembly 108 into a single part number. Thus, the mounting assembly 108 eliminates usage of multiple part numbers for multiple mounting configurations of the electronic assembly 104. This elimination of the usage of multiple part numbers, in turn, reduces cost associated with production and handling of the multiple part numbers.

No element/component, act/action performed by any element/component, or instruction used herein should be construed as critical or essential unless explicitly described as such. Additionally, the phrase "based on" is intended to mean "based, at least in part, on" unless explicitly stated otherwise. Furthermore, the articles "a" and "an," as used herein, are intended to include one or more items, and may be used interchangeably with "one or more." In the event only one item is intended, the term "one" or similar language is used. Moreover, the terms "has," "have," "having," or the like, as also used herein, are intended to be open-ended terms.

The invention claimed is:

1. A mounting assembly for an electronic device associated with a machine, the mounting assembly comprising:
   a housing, of the electronic device, including an interior space adapted to receive one or more components of the electronic device, the housing further including an external enclosure defined by walls of the housing;
   a housing printed circuit board coupled to the housing, the housing printed circuit board having a first row of pins and a second row of pins; and a harness for allowing interface between the electronic device and the machine, the harness configured to be connected to the housing in a first orientation or a second orientation,
  wherein the first orientation is substantially in perpendicular to the second orientation,
  the harness comprising:
    a cable;
    a connecting member provided at one end of the cable, the connecting member adapted to be received within the external enclosure of the housing; and
    a harness printed circuit board having a first row of pins and a second row of pins,
      wherein a plurality of pins, of the first row of pins, of the harness printed circuit board are inactive in each of the first orientation and the second orientation, the harness printed circuit board being configured to connect with the housing printed circuit board,
      wherein, in the first orientation, the first row of pins of the housing printed circuit board is connected to the first row of pins of the harness printed circuit board and the second row of pins of the housing printed circuit board is connected to the second row of pins of the harness printed circuit board,
      wherein, in the first orientation, only pins of a plurality of pins, of the first row of pins, of the housing printed circuit board establish a connection with corresponding two pins of a plurality of pins of the first row of pins of the harness printed circuit board, and
      wherein, in the second orientation, the first row of pins of the housing printed circuit board is connected to the second row of pins of the harness printed circuit board and the second row of pins of the housing printed circuit board is connected to the first row of pins of the harness printed circuit board,
      wherein, in the second orientation, two pins of a plurality of pins, of the second row of pins, of the housing printed circuit board establish a connection with corresponding two pins of a plurality of pins, of the first row of pins of the harness printed circuit board.

2. The mounting assembly of claim 1, wherein the first row of pins, of the housing printed circuit board, is arranged in a particular order and the second row of pins, of the housing printed circuit board, is arranged in a reverse order with respect to the particular order of the first row of pins, and
  wherein pins, of the first row of pins, are same as pins of the second row of pins.

3. The mounting assembly of claim 1, wherein the first row of pins, of the harness printed circuit board, includes Ethernet receive pins, wherein the second row of pins, of the harness printed circuit board, includes Ethernet transmit pins, wherein the Ethernet receive pins are provided at a center position of the first row of pins of the harness printed circuit board, and wherein the Ethernet transmit pins are provided at a center position of the second row of pins of the harness printed circuit board.

4. The mounting assembly of claim 3, wherein the Ethernet receive pins of the first row of pins and each pin of the second row of pins of the harness printed circuit board are active in each of the first orientation and the second orientation.

5. The mounting assembly of claim 3, wherein Ethernet pins of the first row of pins of the housing printed circuit board are connected to the Ethernet receive pins of the first row of pins of the harness printed circuit board and each pin of the second row of pins of the housing printed circuit board are connected to corresponding pins of the second row of pins of the of the harness printed circuit board to complete an electric circuit in the first orientation, and
  wherein Ethernet pins of the second row of pins of the housing printed circuit board are connected to the Ethernet receive pins of the first row of pins of the harness printed circuit board and each pin of the first row of pins of the housing printed circuit board are connected to corresponding pins of the second row of pins of the of the harness printed circuit board to complete an electric circuit in the second orientation.

6. The mounting assembly of claim 5, wherein the electric circuit is completed in the first orientation or the second orientation based on a connection of the harness printed circuit board with the housing printed circuit board, a connection of the harness with a power source, and communication between the housing printed circuit board and the harness printed circuit board with the control unit.

7. The mounting assembly of claim 1, wherein a control unit, associated with the machine, is configured to:
  query the housing printed circuit board and the harness printed circuit board based on:
    the control unit detecting a coupling of the harness in the first orientation or the second orientation, and
    the control unit detecting communication between the housing printed circuit board and the harness printed circuit board with the control unit, and
  selectively assign Ethernet pins of the first row of pins and the second row of pins of the housing printed circuit board as Ethernet receive pins or Ethernet transmit pins based on querying the housing printed circuit board and the harness printed circuit board.

8. The mounting assembly of claim 1, wherein the electronic device is a telematics device, and
  wherein the telematics device receives and transmits information related to the machine,
    a portion of the information related to the machine being received by the telematics device via the harness printed circuit board connected to the housing printed circuit board.

9. A mounting assembly for an electronic device associated with a machine, the mounting assembly comprising:
  a housing printed circuit board coupled to the housing, the housing printed circuit board having a first row of pins and a second row of pins; and
  a harness for allowing interface between the electronic device and the machine, the harness configured to be connected to the housing in a first orientation or a second orientation,
    wherein the first orientation is substantially in perpendicular to the second orientation,
    the harness comprising:
      a harness printed circuit board having a first row of pins and a second row of pins,
        the harness printed circuit board being configured to connect with the housing printed circuit board, wherein the harness printed circuit board includes Ethernet receive pins and Ethernet transmit pins provided at a center position of the first row of pins and the second rows of pins, respectively, of the harness printed circuit board for maintaining electrical connectivity independent of an orientation of the harness with respect to the housing in the first orientation or the second orientation, wherein, in the first orientation, the first row of pins of the housing printed circuit board is connected to the first row of pins of the harness printed circuit board and the second row of pins of the housing printed circuit board is connected to the second row of pins of the harness printed circuit board, wherein, in the first orientation, two pins of a plurality of pins, of the first row of pins, of the housing printed circuit board establish a connection with corresponding two pins of a plurality of pins, of the first row of pins, of the harness printed circuit board, and wherein, in the second orientation, the first row of pins of the housing printed circuit board is connected to the second row of pins of the harness printed circuit board and the second row of pins of the housing printed circuit board is connected to the first row of pins of the harness printed circuit board, wherein, in the second orientation, two pins of a plurality of pins, of the second row of pins, of the housing printed circuit board establish a connection with corresponding two pins of a plurality of pins, of the first row of pins, of the harness printed circuit board.

10. The mounting assembly of claim 9, wherein the first row of pins of the housing printed circuit board is arranged in a particular order and the second row of pins of the housing printed circuit board is arranged in a reverse order with respect to the particular order of the first row of pins, wherein pins, of the first row of pins, are same as pins of the second row of pins.

11. The mounting assembly of claim 9, wherein the Ethernet receive pins of the first row of pins and each pin of the second row of pins of the harness printed circuit board are active in each of the first orientation and the second orientation.

12. The mounting assembly of claim 9, wherein Ethernet pins of the first row of pins of the housing printed circuit board are connected to the Ethernet receive pins of the first row of pins of the harness printed circuit board and each pin of the second row of pins of the housing printed circuit board are connected to corresponding pins of the second row of pins of the of the harness printed circuit board to complete an electric circuit in the first orientation, and wherein Ethernet pins of the second row of pins of the housing printed circuit board are connected to the Ethernet receive pins of the first row of pins of the harness printed circuit board and each pin of the first row of pins of the housing printed circuit board are connected to corresponding pins of the second row of pins of the of the harness printed circuit board to complete an electric circuit in the second orientation.

13. The mounting assembly of claim 12, wherein the electric circuit is completed in the first orientation or the second orientation based on a connection of the harness printed circuit board with the housing printed circuit board, a connection of the harness with a power source, and communication between the housing printed circuit board and the harness printed circuit board with the control unit.

14. The mounting assembly of claim 9, wherein a control unit, associated with the machine, is configured to:
query the housing printed circuit board and the harness printed circuit board based on:
detecting a coupling of the harness in the first orientation or the second orientation, and
detecting communication between the housing printed circuit board and the harness printed circuit board with the control unit, and
selectively assign Ethernet pins of the first row of pins and the second row of pins of the housing printed circuit board as Ethernet receive pins or Ethernet transmit pins based on querying the housing printed circuit board and the harness printed circuit board.

15. The mounting assembly of claim 9, wherein the electronic device is a telematics device, and
wherein the telematics device receives and transmits information related to the machine,
a portion of the information related to the machine being received by the telematics device via the harness printed circuit board connected to the housing printed circuit board.

16. A system associated with a machine, the system comprising:
an electronic device interfacing with the machine; and
a housing printed circuit board, the housing printed circuit board having a first row of pins and a second row of pins; and
a harness for allowing interface between the electronic device and the machine, the harness configured to be connected to a housing, of the electronic device, in a first orientation or a second orientation to provide, to the electronic device, information related to the machine,
wherein the first orientation is different than the second orientation,
the harness comprising:
a harness printed circuit board having a first row of pins and a second row of pins,
wherein a plurality of pins, of the first row of pins, of the harness printed circuit board are inactive in each of the first orientation and the second orientation, the harness printed circuit board being configured to connect with the housing printed circuit board,
wherein, in the first orientation, the first row of pins of the housing printed circuit board is connected to the first row of pins of the harness printed circuit board and the second row of pins of the housing printed circuit board is connected to the second row of pins of the harness printed circuit board,
wherein, in the first orientation, two pins of a plurality of pins, of the first row of pins, of the housing printed circuit board establish a connection with corresponding two pins of a plurality of pins, of the first row of pins, of the harness printed circuit board, and
wherein, in the second orientation, the first row of pins of the housing printed circuit board is connected to the second row of pins of the harness printed circuit board and the second row of pins of the housing printed circuit board is connected to the first row of pins of the harness printed circuit board,
wherein, in the second orientation, two pins of a plurality of pins, of the second row of pins, of the housing printed circuit board establish a connection with corresponding two pins of a plurality of pins, of the first row of pins, of the harness printed circuit board.

17. The system of claim 16, wherein the first row of pins, of the harness printed circuit board, includes Ethernet receive pins and the second row of pins, of the harness printed circuit board, includes Ethernet transmit pins, wherein the Ethernet receive pins are provided at a center position of the first row of pins of the harness printed circuit board, and wherein the Ethernet transmit pins are provided at a center position of the second row of pins of the harness printed circuit board.

18. The system of claim 17, wherein the Ethernet receive pins of the first row of pins and each pin of the second row of pins of the harness printed circuit board are active in each of the first orientation and the second orientation.

19. The system of claim 18, wherein Ethernet pins of the first row of pins of the housing printed circuit board are connected to the Ethernet receive pins of the first row of pins of the harness printed circuit board and each pin of the second row of pins of the housing printed circuit board are connected to corresponding pins of the second row of pins of the of the harness printed circuit board to complete an electric circuit in the first orientation, and wherein Ethernet pins of the second row of pins of the housing printed circuit board are connected to the Ethernet receive pins of the first row of pins of the harness printed circuit board and each pin of the first row of pins of the housing printed circuit board are connected to corresponding pins of the second row of pins of the of the harness printed circuit board to complete an electric circuit in the second orientation.

20. The system of claim 16, wherein the electronic device is a telematics device, and wherein the telematics device receives and transmits information related to the machine,
   a portion of the information related to the machine being received by the telematics device via the harness printed circuit board connected to the housing printed circuit board.

* * * * *